US009287889B2

(12) United States Patent
Chiu et al.

(10) Patent No.: US 9,287,889 B2
(45) Date of Patent: Mar. 15, 2016

(54) SYSTEM AND METHOD FOR DYNAMIC PATH-MISMATCH EQUALIZATION IN TIME-INTERLEAVED ADC

(71) Applicant: The Board of Regents, The University of Texas System, Austin, TX (US)

(72) Inventors: Yun Chiu, Allen, TX (US); Benwei Xu, Richardson, TX (US)

(73) Assignee: The Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/255,168

(22) Filed: Apr. 17, 2014

(65) Prior Publication Data

US 2015/0303934 A1 Oct. 22, 2015

(51) Int. Cl.
*H03M 1/10* (2006.01)
*H03M 1/36* (2006.01)

(52) U.S. Cl.
CPC .............. *H03M 1/1009* (2013.01); *H03M 1/36* (2013.01)

(58) Field of Classification Search
CPC ...... H03M 1/1215; H03M 1/12; H03M 1/121;
H03M 1/1009; H03M 1/0614; H03M 1/126;
H03M 1/1061; H03M 1/662; H03M 1/1225;
H03M 1/36
USPC .......... 341/118, 120, 155, 140, 141, 159, 161
See application file for complete search history.

(56) References Cited

U.S. PATENT DOCUMENTS

| | | | |
|---|---|---|---|
| 7,227,479 B1 | 6/2007 | Chen et al. | |
| 8,248,282 B2 * | 8/2012 | Payne | H03M 1/08 341/122 |
| 8,519,875 B2 | 8/2013 | Straayer et al. | |
| 8,749,410 B1 * | 6/2014 | Van Der Goes | H03M 1/1057 341/118 |
| 8,836,550 B2 * | 9/2014 | Snelgrove | H03M 1/1033 341/118 |
| 2005/0190089 A1 * | 9/2005 | Draxelmayr | H03M 1/0624 341/141 |
| 2006/0176197 A1 * | 8/2006 | McNeill | H03M 1/1004 341/120 |
| 2006/0238397 A1 * | 10/2006 | Nairn | H03M 1/0626 341/155 |

(Continued)

FOREIGN PATENT DOCUMENTS

WO 2010095232 A1 8/2010

OTHER PUBLICATIONS

Stepanovic, Dusan; Calibration Techniques for Time-Interleaved SAR A/D Converters; Technical Report No. UCB/EECS-2012-225, http://www.eecs.berkeley.edu/Pubs/TechRpts/2012/EECS-2012-225.html; Electrical Engineering and Computer Sciences, University of California at Berkeley; Dec. 4, 2012, 116 pages.

(Continued)

*Primary Examiner* — Linh Nguyen
(74) *Attorney, Agent, or Firm* — Greenberg Traurig, LLP; Ross Spencer Garsson (57) ABSTRACT

Disclosed are methods and systems implementing digital background calibration techniques for identifying and remedying dynamic path-mismatch errors in time-interleaved analog-to-digital converters (TI-ADC). The disclosed systems and methods employ a calibration technique specifically focuses on removing the timing skew and input bandwidth mismatches by equalizing each sub-ADC in an array to a common reference ADC using direct input derivative information. The errors are identified by correlating the ensuing conversion error to the input derivatives of various orders to identify the mismatch parameters. Simple passive high-pass filters (HPF) are used to extract input derivatives followed by one-bit quantizers.

26 Claims, 6 Drawing Sheets

(56) References Cited

U.S. PATENT DOCUMENTS

| | | | | |
|---|---|---|---|---|
| 2007/0194960 | A1* | 8/2007 | Wang | H03M 1/1004 341/120 |
| 2010/0085231 | A1* | 4/2010 | Doris | H03M 1/188 341/155 |
| 2011/0260898 | A1* | 10/2011 | Velazquez | H03F 1/3247 341/110 |
| 2012/0262318 | A1* | 10/2012 | Straayer | H03M 1/1057 341/120 |
| 2012/0268299 | A1* | 10/2012 | Kidambi | H03M 1/1052 341/155 |
| 2013/0049999 | A1* | 2/2013 | Oshima et al. | 341/120 |
| 2014/0152477 | A1* | 6/2014 | Lewis | H03M 1/1061 341/122 |

OTHER PUBLICATIONS

Zwei-Mei Lee, et al.; A CMOS 15-bit 125-MS/s Time-Interleaved ADC With Digital Background Calibration; IEEE Journal of Solid-State Circuits, vol. 42, No. 10, Oct. 2007, pp. 2149-2160.

Jamal, S.M., et al.; A 10-bit 120MS/s Time-Interleaved Analog-to-Digital Converter with Digital Background Calibration; ISSCC, Feb. 2002, Paper No. 10.4; 11 pages.

Liu, Wenbo; Low-Power High-Performance SAR ADC Design With Digital Calibration Techniques; Dissertation, Submitted in partial fulfillment of the requirements for the degree of Doctor of Philosophy in Electrical and Computer Engineering in the Graduate College of the University of Illinois at Urbana-Champaign, 2010; Urbana, Illinois; 151 pages.

* cited by examiner

SYSTEM AND METHOD FOR DYNAMIC PATH-MISMATCH EQUALIZATION IN TIME-INTERLEAVED ADC

This application includes material that is subject to copyright protection. The copyright owner has no objection to the facsimile reproduction by anyone of the patent disclosure, as it appears in the Patent and Trademark Office files or records, but otherwise reserves all copyright rights whatsoever.

FIELD

The present disclosure is generally related to calibrating interleaved analog-to-digital converters, and more particularly to methods and systems for calibrating path-mismatch errors in time interleaved analog-to-digital converters.

RELATED ART

Time interleaving (TI) is an effective way of increasing analog-to-digital converter (ADC) sampling speed while saving on the overall power consumption. However, potential mismatches between the parallel analog paths can lower the ADC array linearity performance significantly. It is generally understood that such mismatches are the leading drawback for TI-ADC. Prior research has mostly only focused on the static (independent of frequency) mismatch and/or the timing mismatch issues. Such solutions, however, fail to treat both timing skew and bandwidth mismatch simultaneously. Furthermore, existing solutions often require sophisticated calibration setup, cannot utilize the full Nyquist band after calibration, or require specific input waveforms for calibration. Also, many conventional calibration techniques fail to adapt to process, voltage, and/or temperature changes easily. Indeed, conventional systems employ foreground techniques which impede efficient and accurate solutions required within the landscape discussed herein.

SUMMARY

The present disclosure provides methods and systems implementing digital background calibration techniques for identifying and remedying dynamic path-mismatch errors in time-interleaved analog-to-digital converters (TI-ADC). That is, the present disclosure provides systems and methods expanding upon the current limitations of existing solutions by providing a generic solution to the overall TI-ADC. The disclosed systems and methods employ a calibration technique specifically focusing on removing the timing skew and input bandwidth mismatch by equalizing each sub-ADC in an array to a common reference ADC using direct input derivative information. The errors are identified by correlating the ensuing conversion error to the input derivatives of various orders to identify the mismatch parameters. Simple passive high-pass filters (HPF) are used to extract input derivatives followed by one-bit quantizers.

In accordance with one or more embodiments, a method is disclosed that includes sampling a common input signal, said sampling being performed by an interleaved array of sub-analog-to-digital converters (ADCs), said sampling corresponding to a clock signal associated with said TI-ADC; converting, via each sub-ADC, the input signal into a digital output signal; sampling, via a reference ADC, the input signal, said reference ADC sampling aligning with said sub-ADC sampling; converting, via the reference ADC, the input signal into a digital output signal; determining mismatch errors between the reference ADC output signal and each sub-ADC output signal, said determination comprising simultaneously identifying a timing skew and input bandwidth mismatch between the output signals of the sub-ADCs and reference ADC; generating correction signals in accordance with the determined mismatch errors, said correction signals accounting for said timing skew and input bandwidth mismatch.

In accordance with one or more embodiments, a system is provided that comprises one or more computing devices configured to provide functionality in accordance with such embodiments. In accordance with one or more embodiments, functionality is embodied in steps of a method performed by at least one computing device. In accordance with one or more embodiments, program code to implement functionality in accordance with one or more such embodiments is embodied in, by and/or on an apparatus.

The principles of the present disclosure can be embodied in varying techniques, as discussed in more detail below. Thus, it should be understood that the various embodiments of the present disclosure may include some, all, or none of the enumerated technical advantages. In addition, other technical advantages of the present disclosure may be readily apparent to one skill in the art from the figures, description and claims included herein.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DESCRIPTION OF EMBODIMENTS

The present disclosure will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure is described below with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a processor of a general purpose computer, special purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved. These computer program instructions can be provided to a processor of a general purpose computer, special purpose computer, ASIC, or other programmable data processing apparatus, such that the instructions, which execute via the processor of the computer or other programmable data processing apparatus, implement the functions/acts specified in the block diagrams or operational block or blocks.

The principles described herein may be embodied in many different forms. By way of background, an analog-to-digital converter (ADC) is a device that converts analog signals into digital signals. The device converts the continuous physical quantity (usually voltage) to a digital number representing amplitude of physical quantity. The conversion involves quantization of the input. To avoid any errors an ADC usually performs the conversions periodically instead of in a single conversion. These ADCs find application in communication systems. The communication systems are highly dependent on the employed analog-to-digital converters. In order to make the communication systems more flexible and precise, high performance ADCs can be employed.

Time-interleaved analog-to-digital converter (TI-ADC) technology allows for power-efficient, high-speed sampling and digitization of analog input signals in a time-interleaved (TI) manner. For example, in single ADC channel architectures, three competing parameters 1) precision, 2) speed, and 3) power are typically traded against each other. TI-ADC architecture allows the challenges of achieving high levels of precision to be separated from the challenges of operating at high speeds. In this way, power consumption required to achieve a given sampling rate may be optimized. Generally, TI-ADC technology is the preferred option to achieve extremely high-speed sampling rates.

The time-interleaving (TI) has proven to be a very effective way of increasing ADC sampling speed along with overall savings in power consumption. However, the potential mismatches between the parallel analog paths can lower the ADC array linearity performance significantly and therefore is a block to TI-ADC. Conventional solutions mostly focus upon static (independent of frequency) mismatch and/or timing mismatch issues. Such solutions fail to treat both timing skew and bandwidth mismatch simultaneously. Conventional systems employing foreground treatment also lack the ability to adapt the treatment to process, voltage, and temperature (PVT) changes easily and efficiently.

Indeed, TI-ADC is a type of converter array with multiple parallel sampling channels. The sampling frequency of each channel does not need to satisfy the Nyquist criterion individually; rather the sampling frequency of the combined output of all channels in the TI-ADC should satisfy the Nyquist criterion. Under ideal conditions, the sampling rate of TI-ADCs increases proportionally to the number of interleaved parallel ADC channels. In practice, each ADC channel introduces a number of component errors, such as, for example, phase shift errors in clock signals. TI-ADCs are known to give rise to new performance limiting errors that are caused by transfer path mismatch (e.g. propagation delay), gain, and offset mismatch between the multiple ADC channels.

The present disclosure remedies such drawbacks of TI-ADCs by utilizing a digital adaptive equalization technique to correct mismatch errors in TI-ADC in a comprehensive manner, no matter the error being static or dynamic. The proposed systems and methods run fully in the background, and do not require any special setup or input signal for calibration. The simplicity of the calibration systems and methods (e.g., techniques and/or algorithms) and the novel detection and utilization of input derivative information is an improvement upon conventional calibration techniques/solutions/algorithms.

The disclosed digital background calibration systems and methods can be used for all TI-ADC types. The disclosed systems and methods employ the use of direct input derivative information for the simultaneous identification of timing skew and input bandwidth mismatch errors. This leads to a comprehensive background calibration, in that all static, as well as dynamic mismatch errors are treated in one common reference equalization framework. That is, as discussed in more detail below, dynamic mismatch errors are identified by correlating the ensuing conversion error to the input derivatives of various orders to identify the mismatch parameters. In some embodiments, passive high-pass filters (HPF) are used to extract input derivative information followed by one-bit quantizers.

Indeed, the proposed systems and methods can be utilized by, for example (and not to be construed as limiting applicability), data converter vendors, instrument manufacturers, semiconductor design companies for commercial deployment in their product lines of high-speed ADC or waveform digitizers, and the like. Thus, by way of a non-limiting example, processors processing received digital codes to provide various applications (e.g., user applications) may be implemented as multiple processing units, each potentially operating independently. The description of the present disclosure is accordingly continued with the details of a time-interleaved ADC that address at least some of the issues noted above according to various embodiments of the present disclosure.

Figure 1:
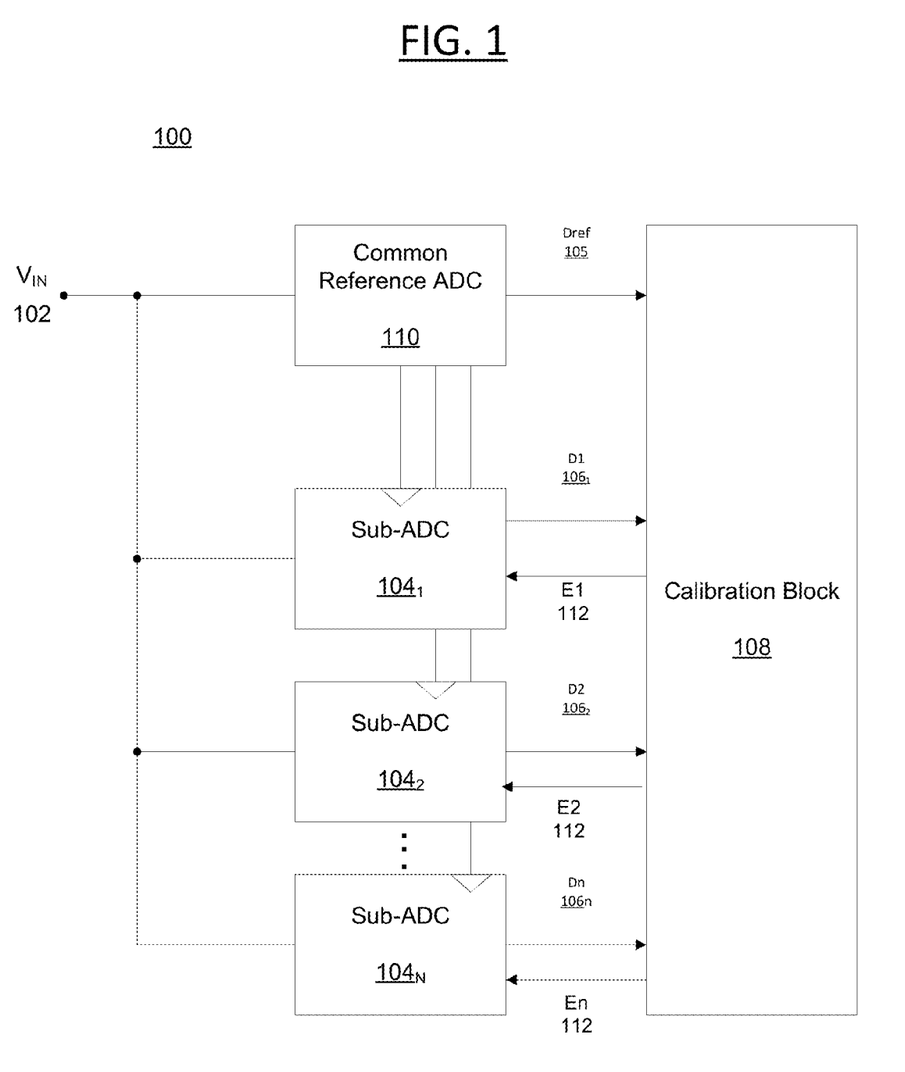
FIG. 1 is a high-level block diagram of a time-interleaving analog-to-digital converter according to some embodiments of the present disclosure.

Certain embodiments will now be described in greater detail with reference to the figures. FIG. 1 is a high-level block diagram of a time-interleaving analog-to-digital converter (TI-ADC) according to some embodiments of the present disclosure. As discussed herein, FIG. 1 illustrates a TI-ADC diagram 100 that includes an input signal 102 into N number of interleaved sub-ADCs 104 and a Reference ADC 110, with digital data outputs $D_{REF}$ 105 and $D_{1-N}$ 106, being output from 110 and 104, respectively, as input to a digital calibration block 108.

TI-ADC 100, as discussed herein, implements systems and methods for digital background calibration by identifying and remedying dynamic path-mismatch errors in time-interleaved analog-to-digital converters (TI-ADC). The disclosed systems and methods employ a calibration technique specifically focuses on removing the timing skew and input bandwidth mismatches by equalizing each sub-ADC 104 in an array to a common reference ADC 110 using direct input derivative information. As discussed in more detail below, the mismatch parameters are identified by correlating the ensuing conversion error to the input derivatives of various orders. Calibration to treat the dynamic path mismatch errors occurs in the background and without interrupting the conversion process. According to some embodiments, the input signal 102, which can be referred to as a common input signal, is input into N number of interleaved sub-ADCs 104 used for N-way interleaving. In some embodiments, reference ADC 110 is a multi-bit quantizer. In some embodiments, the quantizer enables the reference ADC 110 to have an accuracy that is equal to or higher than the accuracy of each sub-ADC 104. In some embodiments, as discussed in more detail below, reference ADC 110 samples input signal 102 at a predetermined timing relationship with respect to each sub-ADC 104.

As a result of the reference ADC 110, a total of N+1 ADC channels are provided, as illustrated in FIG. 1. These channels 105 and 106 are a result of converting the input signal 102 into a digital output resulting in a set of N+1 ADC digital outputs. The digital outputs that may be in any format that contains information about input signal 102. As discussed in more detail below, such information aids in the correction of path-to-path or channel-to-channel mismatch errors. For example, reference ADC parameters, such as, but not limited to, sampling time, offset, gain, integral non-linearity, and the like, can be defined to serve as reference data against which sub-ADC parameters are computed to calibrate the corresponding sub-ADC 104. The reference ADC's own parameters may be calibrated by any technique known or to be known to those skilled in the art.

Digital data output 106 from each sub-ADC channel 104 is forwarded to digital calibration block 108. According to some embodiments, digital calibration block 108 is placed in feedback with reference ADC 110 and/or sub-ADC 104. In some embodiments, there may be one digital calibration block for each channel. Digital calibration block 108 is coupled to receive the N digital outputs 106 of sub-ADC channels 104 and the output data 105 of reference ADC channel 110. As discussed in more detail below, for each type of mismatch error to be corrected and for each channel, digital calibration block 108 may store and adjust an estimate of the specific mismatch error. Each sub-ADC channels 104 is coupled to receive from digital calibration block 108 analog or digital feedback control signals 112 for each mismatch error ($E_{1-N}$). As discussed in more detail below, feedback control signals 112 are used to correct the mismatch errors within each interleaved sub-ADC 104 either through appropriate analog or digital methods. According to some embodiments, the digital calibration block 108 can correct mismatch errors without feedback control signals in such way that the mismatch errors are corrected in the digital domain by the digital calibration block 108.

Figure 2:
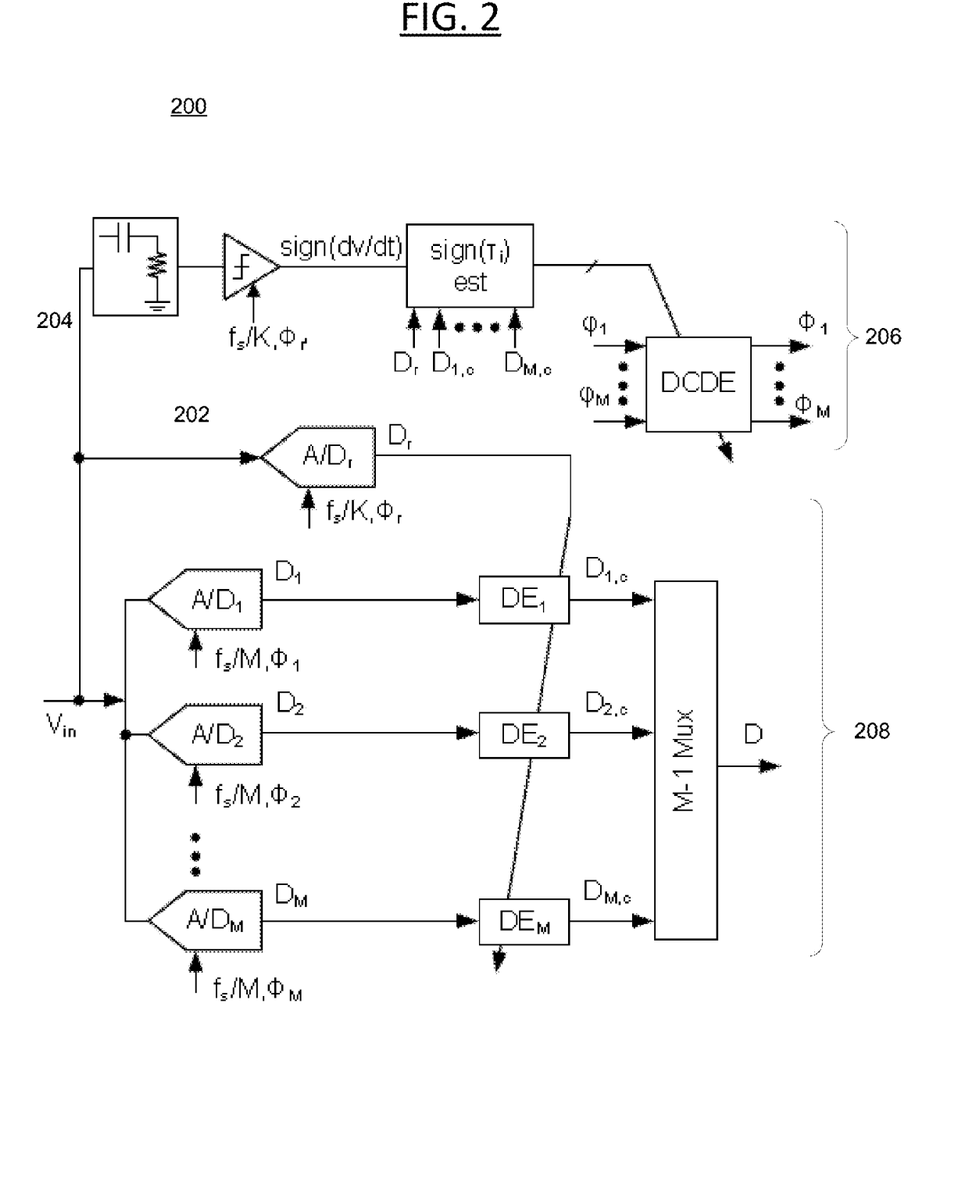
FIG. 2 is a block diagram of a TI-ADC architecture according to embodiments of the present disclosure.

FIG. 2 is a block diagram of TI-ADC architecture 200; and more specifically, FIG. 2 illustrates an adaptive equalization of a TI-ADC array with two auxiliary paths: the reference path and a derivative path. As discussed above, the present disclosure provides systems and methods for novel equalization-based online calibration that incorporates a one-bit derivative path in addition to a full-resolution reference ADC to simultaneously estimate the sign of the skew error and the errors resulting from static path mismatches. The skew information is subsequently utilized by a digitally controlled delay element (DCDE) to correct the timing errors of the interleaved sampling circuits. Additionally, a static equalization is performed in the meantime of the skew correction by comparing the full-resolution reference ADC output with those of the interleaved sub-ADCs. Although the skew correction and the static equalization are treated simultaneously as illustrated in FIG. 2, it is also understood that the two can be separated in some embodiments.

The illustrated architecture in FIG. 2 shows two auxiliary analog paths used to facilitate the calibration. The first auxiliary path 202 consists of a slow-but-linear reference ADC digitizing the analog input along with the main ADC array. The second auxiliary path 204 is composed of a high-pass filter (HPF) followed by a comparator. The second path is devised to capture the sign of the input signal derivative. Since only the sign of the derivative is needed, a single zero-crossing comparator can be used in the second path, which greatly simplifies the skew estimation hardware 204.

Figure 3:
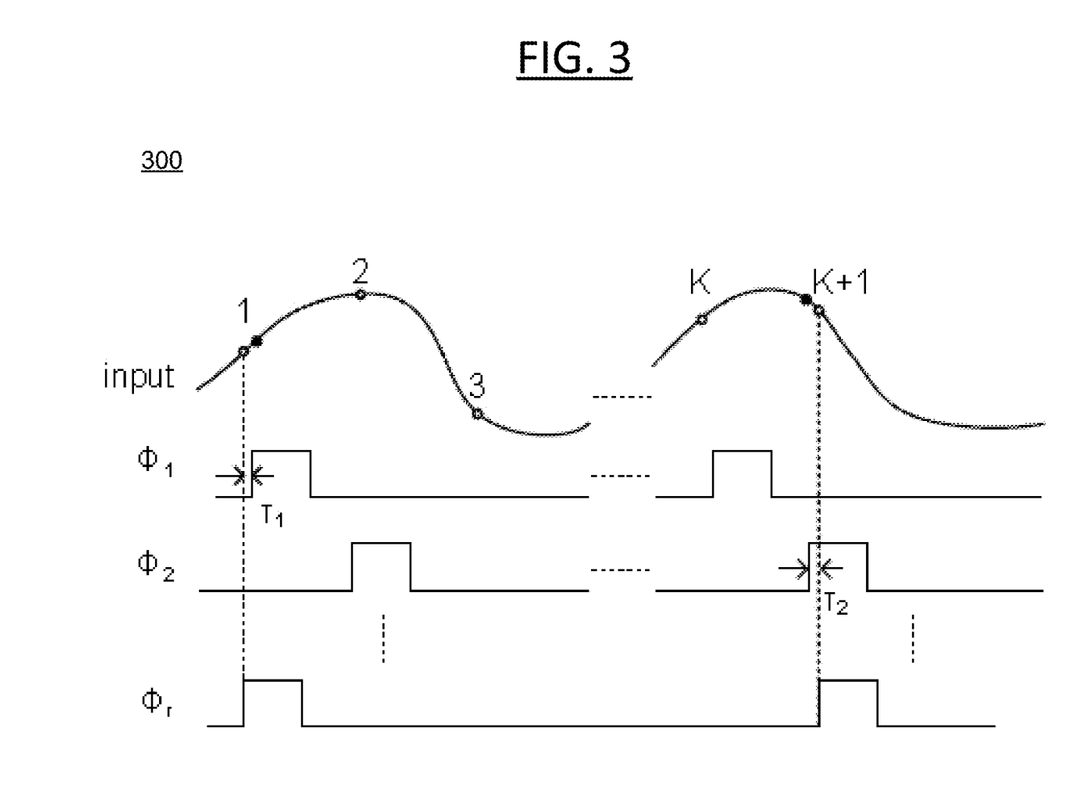
FIG. 3 illustrates a timing diagram of the TI-ADC architecture of FIG. 2 according to some embodiments of the present disclosure.

FIG. 3 illustrates a timing diagram of the TI-ADC architecture 200. $\Phi i$ is the sampling clock of the $i_{th}$ sub-ADC, which samples at a rate of fs/N (fs is the aggregate sample rate of the array and N is the interleaving factor). $\Phi r$ is the sampling clock of the reference ADC and the derivative path comparator, which are clocked at a rate of fs/K. As long as N and K are co-prime, the sampling instance of $\Phi r$ will coincide with those of $\Phi i$'s and be evenly distributed over the array. Clock skews between $\Phi r$ and $\Phi i$'s are shown as $\tau i$'s in the same figure. In practice, a skew between the two auxiliary paths will also exist, and $\Phi r'$ will be used to denote the derivative path clock in the following discussion. The impact of this skew will be discussed in more detail below.

In order to explain the proposed skew calibration algorithm implemented by the skew calibration hardware 206 within the proposed systems and methods of the present disclosure, assume that there is no static mismatch between the reference ADC 110 and sub-ADCs 104 for simplicity. In this case, any difference between the digital outputs of the reference ADC and the sub-ADCs are caused by the skew (due to a non-zero input slope). If the sign of the input slope at the sampling instant is known, the sign of the skew ($\tau i$) can be determined. For example, in FIG. 3, at the sampling instant of $\Phi_1$, the input signal derivative (dV/dt) is positive while the skew error ($D_r$–$D_i$) is negative. So $\Phi_1$ is lagging and $\tau_1$ is positive. A general equation for skew sign estimation is:

$$\text{sign}(\tau_i) = -\text{sign}(D_r - D_i) \cdot \text{sign}\left(\frac{dV}{dt}\right)$$

After the sign of the skew is identified, a DCDE can be used to adjust the sampling clock of each sub-ADC, forcing them to be synchronized with the auxiliary paths thus free of relative skew errors. In s-domain taking the derivative of a signal is equivalent to multiplying its Laplace transform by s. The transfer function of the C-R HPF in the derivative path as shown in FIG. 2 is s/s+ωc, where ωc=1/RC. When |s|<<ωc holds, this transfer function can by approximated as s/ωc, which is a differentiator. After the input signal passes the HPF, its sign is detected by the zero-crossing comparator directly. A subsequent digital estimator then determines the sign of the skew according to the above equation.

FIG. 2 also illustrates an embodiment of static mismatch calibration hardware 208. Online equalization of static mismatch errors using the reference ADC output can also be performed. Adapting the digital equalizers (DE) after each sub-ADC forces the difference between each sub-ADC and the reference ADC outputs to be zero. In turn, the cascade of a sub-ADC and a DE effectively mimics the characteristics of the reference ADC. Since every sub-ADC is equalized to the common reference, all static mismatches are removed with equalization. The existence of skew-related errors in general does not affect the static calibration as long as the skew error exhibits a symmetrical probability distribution around zero which will be averaged out in the iterative adaptation loop. That is, the skew error acts like noise for the static equalization and the net effect is usually some slowdown of the static learning. Thus, the static equalization 208 and the skew calibration 206, as described above, are launched at the same time at system startup and converge simultaneously.

Figure 4:
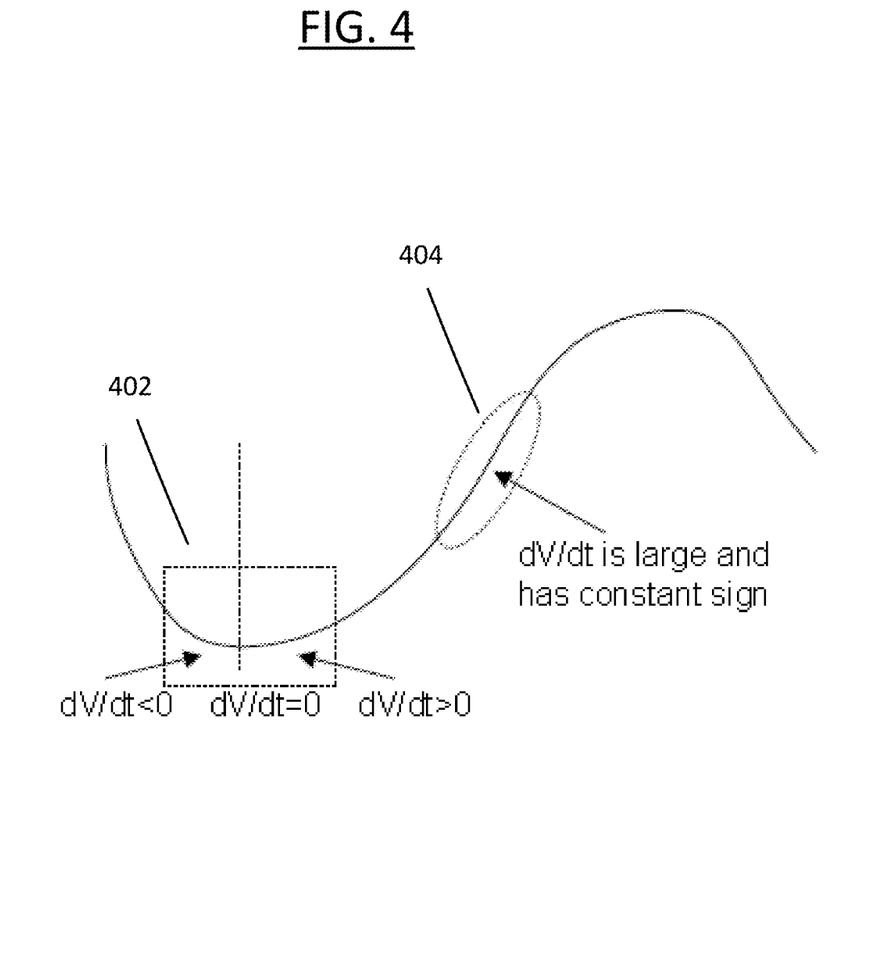
FIG. 4 illustrates a diagram of a derivative offset according to some embodiments of the present disclosure.

According to some embodiments, since skew exists between Φi, Φr, and Φr', as discussed above, the sign of the derivative can be different at these three sampling instances. However, if the derivative changes sign in between Φi, Φr, and Φr', there is a time point at which the derivative is zero. For any band-limited continuous-time signal, dV/dt=0 between Φi, Φr, and Φr' simply means that dV/dt is small during this time period for any reasonable skew magnitude. This scenario is illustrated in the square dashed box 402 in FIG. 4. In this case, the skew error ΔVi=τi·dV/dt is small or even negligible. Therefore, even if the obtained derivative information is wrong, a false skew update can be avoided by setting a threshold for the skew error in the calibration. In contrast, when the derivative of the input signal is large as shown in the dashed circle 404 in FIG. 4, the derivative sign is always consistent at Φi, Φr, and Φr'. Thus, the derivative sign estimation occurring within the disclosed systems and methods is always reliable.

TI-ADC architecture discussed herein employs a comparator-based background calibration technique. As illustrated in FIG. 2, path 204 utilizes a comparator following the HPF; and in some embodiments, a digital calibration block 108 may implement a comparator. For example, digital calibration block 108 uses feedback information to calibrate for errors in sub-ADC 104, such as, for example, timing skew.

As discussed above and detailed more specifically below, a skew calibration scheme for TI-ADC using direct one-bit derivative information is provided, where the skew calibration 206 is integrated with static equalization 208 for concurrent calibration of both skew and static mismatch errors. In addition to the skew equalization 206 and static mismatch equalization 208 discussed above, the TI-ADC architecture also implements bandwidth equalization 502 hardware, as discussed in more detail below with reference to FIG. 5.

Figure 5:
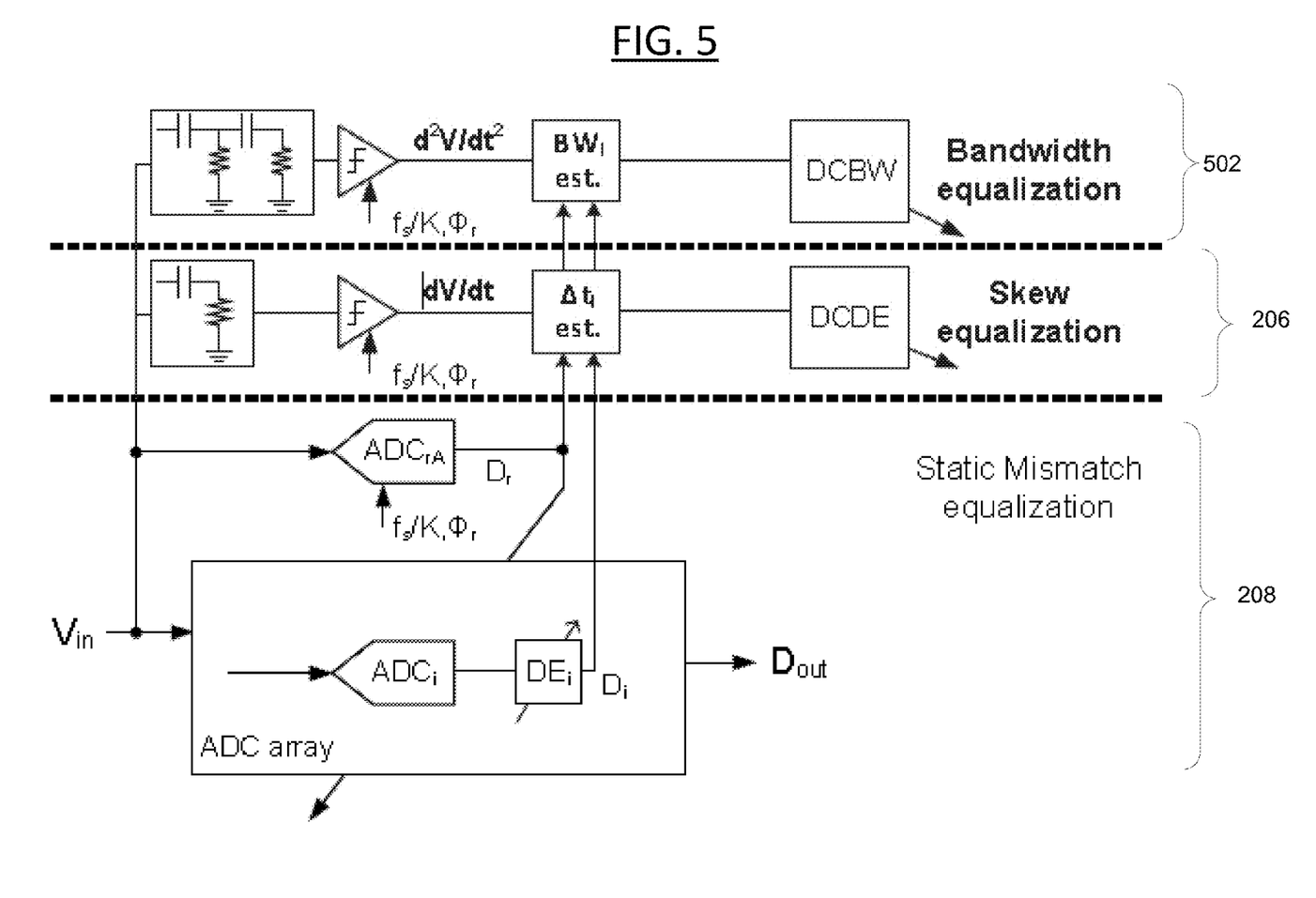
FIG. 5 illustrates a block diagram of TI-ADC architecture according to embodiments of the present disclosure.

FIG. 5 is a block diagram of a TI-ADC apparatus including bandwidth equalization 502 hardware used for treating dynamic path-mismatch errors by focusing on removing the timing skew and input bandwidth mismatch by equalizing each sub-ADC in an array to common reference ADC using direct input derivative information, according to various embodiments. It should be understood that for any embodiment of the calibration discussed herein, the error may be corrected through any known or to be known analog or digital methods, or combination thereof. According to an embodiment, the bandwidth equalization 502 hardware includes the input 102 transformed into an input signal second derivative ($d^2v/dt^2$) through the utilization of a second-order high-pass filter, as illustrated in FIG. 5, 502, and discussed in more detail below. As such, the input signal second derivative is subsequently utilized by a digitally controlled bandwidth adjustment circuit (DCBW).

As discussed above, skew calibration alone cannot ensure the linearity of a wideband TI-ADC array when bandwidth mismatch is present. Thus, input derivative information for the skew error correction is extended to the treatment of the bandwidth mismatch errors, resulting in a comprehensive dynamic error calibration of TI-ADC arrays, as provided in item 502.

By way of developing such bandwidth mismatch calibration provided by hardware 502, bandwidth mismatch between the sub-ADC paths is analyzed. That is, for example, and not to be construed as a limiting development example, a conventional single-pole, low-pass model of the S/H network, i.e., the voltage transfer function (VTF) of a reference time-interleaved sample-and-hold network (S/H) and the $i^{th}$ interleaved S/H paths is utilized, which can be expressed as, for example:

$$H_0(j\omega) = \frac{1}{1 + \frac{j\omega}{\omega_c}}, \quad (1)$$

$$H_i(j\omega) = \frac{e^{j\omega Td_i}}{1 + \frac{j\omega}{\omega_c(1 + \Delta_i)}}, \quad (2)$$

Where:
$H_0(j\omega)$ refers to the VTF of the reference S/H;
$H_i(j\omega)$ refers to the VTF of the $i^{th}$ S/H;
T is defined as 1/fs;
$d_i$ is defined as the Fractional timing skew of the $i^{th}$ S/H;
$\omega_c$ is the Nominal pole frequency of the S/H; and
$\Delta_i$ is the Fractional pole frequency mismatch of the $i^{th}$ S/H The dynamic errors caused by the skew and bandwidth mismatch between the reference S/H and the ith S/H paths can be analytically derived by differencing equations (1) and (2); the result can be further simplified with a series expansion and keeping only the first-order terms, yielding:

$$E_i(j\omega) = H_i - H_0 \approx \frac{\omega_c}{\omega_c + j\omega}\left(\frac{j\omega\Delta_i}{\omega_c + j\omega} + j\omega Td_i\right). \quad (3)$$

The skew-related and bandwidth mismatch-related terms can be separated and expressed in the powers of jω, $$E_{BW} = \frac{j\omega \cdot \omega_c}{(\omega_c + j\omega)^2} \cdot \Delta_i \approx \left[\frac{j\omega}{\omega_c} - \frac{2(j\omega)^2}{\omega_c^2} + \frac{3(j\omega)^3}{\omega_c^3} \dots \right]\Delta_i, \quad (4)$$

$$E_{SK} = \frac{j\omega \cdot \omega_c}{\omega_c + j\omega} \cdot Td_i \approx \left[j\omega - \frac{(j\omega)^2}{\omega_c} + \frac{(j\omega)^3}{\omega_c^2} \dots \right]Td_i. \quad (5)$$

The frequency-domain expressions of (4) and (5) can be translated into the time domain, resulting in:

$$E_{BW} \approx \left[\frac{1}{\omega_c}\frac{dV_{in}}{dt} - \frac{2}{\omega_c^2}\frac{d^2V_{in}}{dt^2} + \frac{3}{\omega_c^3}\frac{d^3V_{in}}{dt^3}\right]\Delta_i, \quad (6)$$

$$E_{SK} \approx \left[\frac{dV_{in}}{dt} - \frac{1}{\omega_c}\frac{d^2V_{in}}{dt^2} + \frac{1}{\omega_c^2}\frac{d^3V_{in}}{dt^3}\right]Td_i \quad (7)$$

Equations (6) and (7) reveal that even though the timing and bandwidth errors take different forms, they invariably are functions of the various orders of the input derivatives. Once these derivatives are known, theoretically $d_i$ and $\Delta_i$ can be solved.

According to some embodiments, it is not necessary to know all of the operating parameters to devise a solution. Such embodiment can exist in an iterative method such as employing a DCDE for skew correction. For example, according to some embodiments, if the first- and second-order input derivatives are known, they can be correlated to the $E_i$ term of (3), and using (6) and (7), resulting in:

$$C_1 = \overline{E_i \cdot \frac{dV}{dt}} = \overline{\left(\frac{dV}{dt}\right)^2}\left(\frac{\Delta_i}{\omega_c} + Td_i\right), \quad (8)$$

$$C_2 = \overline{E_i \cdot \frac{d^2V}{dt^2}} = -\overline{\left(\frac{d^2V}{dt^2}\right)^2}\left(\frac{2\Delta_i}{\omega_c^2} + \frac{Td_i}{\omega_c}\right). \quad (9)$$

To arrive at (8) and (9), according to some embodiments, it is assumed that the various cross-correlations between different derivative terms are negligibly small relative to the (non-negative) auto-correlation of these terms after time averaging. Thus, (8) and (9) can be solved to obtain $d_i$ and $\Delta_i$.

However, according to some embodiments, even when the cross-correlation terms are not completely negligible, an iterative loop can be formed to drive $C_1$ and $C_2$ to zero, which is only possible when $d_i$ and $\Delta_i$ are identically zero, in embodiments when the system of FIG. 5 is solvable. Thus, based on the above analysis, FIG. 5 provides a comprehensive TI-ADC calibration approach. In addition to the skew-calibration block including a first-order CR HPF, a zero-crossing comparator, and a DCDE circuit, a bandwidth mismatch-calibration block 502 is also included consisting of a second-order CR HPF, a zero-crossing comparator, and a S/H bandwidth adjustment circuit controlled digitally (DCBW). In this approach, again the static calibration loop and the two dynamic loops are launched simultaneously. According to some embodiments, the second-order HPF is realized by a direct cascade of two first-order ones, while the DCBW takes the form of adjusting the bootstrapped gate-source drive of the bottom-plate sampling transistor in a standard clock-bootstrapping circuit.

Thus, as provided in the above analysis, accounting for the addition of the bandwidth equalization 502 hardware in TI-ADC, the present disclosure involves a comprehensive digital background calibration technique to treat the dynamic path-mismatch errors. The systems and methods discussed herein treat the error in time-interleaved analog-to-digital converter (TI-ADC) by specifically focusing on removing the timing skew and the input bandwidth mismatch errors.

Furthermore, an important feature regarding the two derivative paths, discussed above (e.g., a $1^{st}$ order dV/dT, and the other $2^{nd}$ order $d^2V/dT^2$), involves embodiments where the HPFs do not need to accurately represent the input derivatives. That is, more specifically, through a detailed analysis of the second-order CR HPF employed above in item 502, reveals, for example, the following VTF:

$$H(s) = \frac{s^2 R_1 C_1 R_2 C_2}{1 + s(R_1 C_2 + R_1 C_1 + R_2 C_2) + s^2 R_1 C_1 R_2 C_2}. \quad (10)$$

In some embodiments, equation (10) can be expanded via implications of equations (4) and (5), discussed above, to show that the techniques discussed herein are applicable in the presence of actual device and circuit non-idealities. Indeed, implicating equations (4) and (5), in which the skew and bandwidth mismatch errors are represented in polynomials of $j\omega$, (10) can be expanded in ascending powers of s, for example:

$$H(s) = k_1 \cdot s + k_1 \cdot s^2 + k_1 \cdot s^3 + \dots, \quad (11)$$

Equation (11) indicates that the HPF output can be viewed as a linear combination of various orders of the input derivatives. Thus, in some embodiments, the desirable derivative terms are always present in the output of the HPFs, which enable the correlations defined in (8) and (9). Therefore, the derivative filters do not necessarily have to be accurate in their designated representations of the input derivatives. In some embodiments, when zero-forcing is selected to drive the adaptive calibration process, potentially large analog impairments in an actual implementation of the HPFs can be tolerated in estimating the derivatives.

Equation (11) also reveals that the disclosed skew calibration and the bandwidth calibration hardware need not to be restricted to the first-order HPF and the second-order HPF, respectively, according to some embodiments. That is, according to some embodiments, when the two are swapped, i.e., the first-order HPF is employed by the bandwidth calibration hardware and the second-order HPF is employed by the skew calibration hardware, the comprehensive dynamic equalization still functions as it is intended to. Thus, the "passive HPFs of various orders" are to be broadly understood as input derivative, slope, or frequency detectors that neither have to abide to the narrow definition of HPFs nor be passive, although a passive HPF perhaps embodies an implementation of the lowest cost among all possible passive or active slope detectors.

Figure 6:
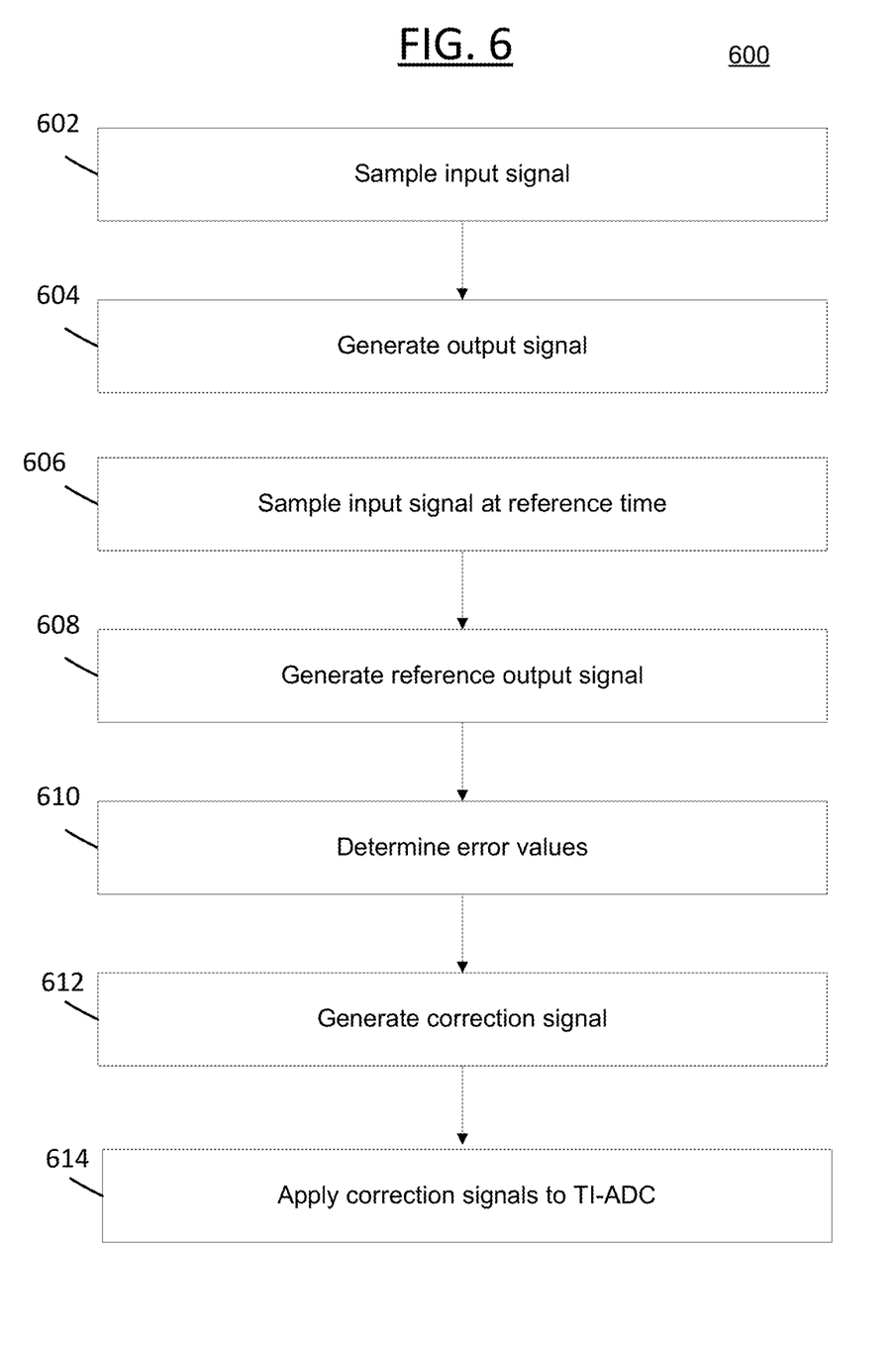
FIG. 6 is a flow chart of an illustrative process for calibrating TI-ADC architecture in accordance with some embodiments of the present disclosure.

FIG. 6 is a flow chart of an illustrative process 600 for calibrating TI-ADC architecture in accordance with various embodiments of the present disclosure. According to some embodiments, the steps of FIG. 6 are all performed in the background. Indeed, all static mismatch errors, as well as all dynamic mismatch errors are identified and treated in one common reference-equalization framework, as illustrated in FIG. 5 and discussed above.

At step 602, an analog input signal is sampled by a number of sub-ADCs, as discussed above with reference to FIGS. 1, 2 and 8. The sampling of the input signal are respective a clock signal that may be generated internally or externally, and may be delayed by, for example, a variable delay prior to sampling. At step 604, each sub-ADC converts the analog input signal into a digital output signal. Each sub-ADC is equalized respective a common reference ADC using direct input derivative information as a correction signal.

At step 606, the analog input signal is sampled by the reference ADC. The sampling of the reference ADC consecutively aligns with the sampling of each sub-ADCs. According to some embodiments, the alignment of sampling results in an overlapping of the reference ADC sampling with sampling for each of the sub-ADCs. At step 608, the reference ADC converts the analog input signal into a digital reference output signal. It should be understood by those of skill in the art that steps 602 and 606 can be performed simultaneously, as well as steps 604 and 608.

At step 610, mismatch errors are determined from a difference between the digital output signal and the digital reference output signal. That is, according to some embodiments, timing skew and input bandwidth mismatches are simultaneously determined by comparing each sub-ADC in the array to the common reference ADC. In some embodiments, as discussed above, step 610 involves simultaneously estimating the sign of the skew error and the errors resulting from static path mismatches. The skew information is utilized by a digitally controlled delay element (DCDE) to correct the timing errors of the interleaved sampling circuits. Additionally, a static equalization is performed in the meantime of the skew correction by comparing the full-resolution reference ADC output with those of the interleaved sub-ADCs. Thus, each output from the sub-ADCs is equalized to the common reference ADC output using direct input derivative information. Additionally, while simultaneously correcting the timing skew, the signs of the bandwidth mismatch errors are identified. This involves estimating the bandwidth information of the outputs from the sub-ADCs. That is, the bandwidth information comprises errors between the bandwidth of the output signals of the sub-ADCs and the reference ADC, where the bandwidth information is utilized by a digitally controlled bandwidth equalizer (DCBW) to correct the bandwidth mismatch errors of the interleaved sub-ADCs, as discussed above with reference to FIG. 5.

The mismatch errors are identified by correlating the ensuing conversion error to the input derivatives of various orders to identify the dynamic mismatch parameters. As discussed above, the input derivatives (e.g., first-order derivatives or second-order derivatives) are extracted through first-order and/or second-order high-pass filters (HPFs) followed by one-bit quantizers. The correlation is, as discussed above, based upon a correlation function that comprises information derived from the input signal (e.g., information about the analog input signal at the time of sampling of the reference ADC). That is, the ensuing correlation function comprises factors that may be dependent on any information regarding the signal or quantized output of interest, such as, but not limited to, slope, derivative, frequency, ADC decisions, and the like.

At step 612, correction signals are generated from the output of step 610 (e.g., identification of timing skew and input bandwidth mismatch errors). At step 614, the correction signals are fed back to the respective control circuits of each sub-ADC to minimize the mismatch errors between each sub-ADC and the common reference ADC. Thus, as discussed herein, all static mismatch, as well as dynamic mismatch errors can be treated via a common-reference-equalization framework.

For the purposes of this disclosure a module is a software, hardware, or firmware (or combinations thereof) system, process or functionality, or component thereof, that performs or facilitates the processes, features, and/or functions described herein (with or without human interaction or augmentation). A module can include sub-modules. Software components of a module may be stored on a computer readable medium for execution by a processor. Modules may be integral to one or more servers, or be loaded and executed by one or more servers. One or more modules may be grouped into an engine or an application.

Those skilled in the art will recognize that the methods and systems of the present disclosure may be implemented in many manners and as such are not to be limited by the foregoing exemplary embodiments and examples. In other words, functional elements being performed by single or multiple components, in various combinations of hardware and software or firmware, and individual functions, may be distributed among software applications at either the client level or server level or both. In this regard, any number of the features of the different embodiments described herein may be combined into single or multiple embodiments, and alternate embodiments having fewer than, or more than, all of the features described herein are possible.

Functionality may also be, in whole or in part, distributed among multiple components, in manners now known or to become known. Thus, myriad software/hardware/firmware combinations are possible in achieving the functions, features, interfaces and preferences described herein. Moreover, the scope of the present disclosure covers conventionally known manners for carrying out the described features and functions and interfaces, as well as those variations and modifications that may be made to the hardware or software or firmware components described herein as would be understood by those skilled in the art now and hereafter.

Furthermore, the embodiments of methods presented and described as flowcharts in this disclosure are provided by way of example in order to provide a more complete understanding of the technology. The disclosed methods are not limited to the operations and logical flow presented herein. Alternative embodiments are contemplated in which the order of the various operations is altered and in which sub-operations described as being part of a larger operation are performed independently.

While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure.

What is claimed is:

1. A method for calibrating a time-interleaved analog-to-digital converter (TI-ADC), comprising:
   sampling a common input signal, said sampling performed by an interleaved array of sub-analog-to-digital converters (ADCs), said sampling corresponding to a clock signal associated with said TI-ADC;
   converting, via each sub-ADC, the input signal into a digital output signal;
   sampling, via a reference ADC, the input signal, said reference ADC sampling aligning with said sub-ADC sampling;
   converting, via the reference ADC, the input signal into a digital output signal;
   determining mismatch errors between the reference ADC output signal and each sub-ADC output signal, said determination comprising simultaneously identifying a timing skew mismatch and an input bandwidth mismatch between the output signals of the sub-ADCs and reference ADC, wherein said identification of the timing skew mismatch comprises using timing skew estimation circuitry, said identification of the input bandwidth mismatch comprises using input bandwidth estimation circuitry, and said timing skew estimation circuitry and said input bandwidth estimation circuitry are utilized simultaneously to simultaneously identify said timing skew mismatch and said input bandwidth mismatch; and generating correction signals in accordance with the determined mismatch errors, said correction signals accounting for said timing skew mismatch and said input bandwidth mismatch.

2. The method of claim 1, further comprising:
extracting input derivatives from the input signal; and
correlating an ensuing conversion error to said input derivatives.

3. The method of claim 2, wherein said input derivatives are associated with a first order high-pass filter, said input derivatives corresponding to skew equalization.

4. The method of claim 2, wherein said input derivatives are associated with a first order high-pass filter, said input derivatives corresponding to bandwidth equalization.

5. The method of claim 2, wherein said input derivatives are associated with a second order high-pass filter, said input derivatives corresponding to bandwidth equalization.

6. The method of claim 2, wherein said input derivatives are associated with a second order high-pass filter, said input derivatives corresponding to skew equalization.

7. The method of claim 2, wherein said ensuing conversion error is based upon a correlation function that comprises information derived from said input signal.

8. The method of claim 1, further comprising feeding back said correction signals to each sub-ADC.

9. The method of claim 1, wherein said determination of simultaneously identifying said timing skew mismatch and said input bandwidth mismatch comprises equalizing each sub-ADC output to the reference ADC output.

10. The method of claim 9, further comprising:
estimating skew information, said skew information comprising a sign of the error of the timing skew and errors resulting from static path mismatches, wherein said skew information is utilized by a digitally controlled delay element (DCDE) to correct the timing errors of the interleaved sub-ADCs; and performing a static equalization simultaneously with said skew information estimation, said static equalization comprising comparing the reference ADC output with each interleaved sub-ADC output, wherein each output from the sub-ADC array is equalized to the reference ADC output using direct input derivative information.

11. The method of claim 9, further comprising:
estimating bandwidth information, said bandwidth information comprising errors between the input bandwidth of the sub-ADCs and the reference ADC, wherein said bandwidth information is utilized by a digitally controlled bandwidth equalizer (DCBW) to correct bandwidth errors of the interleaved sub-ADCs.

12. The method of claim 1, wherein said calibration occurs fully in the background.

13. A device comprising:
a processing unit for processing an output of a time-interleaved analog-to-digital converter (TI-ADC), said TI-ADC configured to calibrate an input signal into said output for said processing unit, said TI-ADC comprising:
a plurality of sub-ADCs, each of said plurality of sub-ADCs sampling said input signal at specific time points specified by a corresponding sampling clock to generate a subset of digital output signals;

a reference ADC, said reference ADC sampling said input signal at said specific time points to generate a reference digital output signal;

a first order high-pass filter, said first order high-pass filter extracting input derivatives from said input signal, said input derivatives associated with a skew equalization of a time skew error;

a second order high-pass filter, said second order high-pass filter extracting second derivatives from said input signal, said second derivatives associated with bandwidth equalization of a bandwidth mismatch; and a comparator, said comparator minimizing channel-to-channel mismatch error caused by simultaneous skew equalization and bandwidth equalization, said minimizing enabling correction of signals to each sub-ADC.

14. A time-interleaved analog-to-digital converter (ADC) comprising:
a plurality of interleaved sub-ADCs configured to sample a common input signal, said sampling corresponding to a clock signal associated with said TI-ADC, each sub-ADC further configured to convert the input signal into a digital output signal;

a reference ADC configured to sample the input signal, said reference ADC sampling aligning with said sub-ADC sampling, the reference ADC further configured to convert the input signal into a digital output signal; and a calibration unit configured to determine mismatch errors between the reference ADC output signal and each sub-ADC output signal, the calibration unit further configured to simultaneously identify (a) a timing skew mismatch utilizing timing skew estimation circuitry and (b) an input bandwidth mismatch utilizing input bandwidth estimation circuitry between each output signal, said calibration unit further configured to generate correction signals in accordance with the determined mismatch errors, said correction signals accounting for said timing skew and said input bandwidth mismatch, wherein the correction signals are fed back to each sub-ADC.

15. The TI-ADC of claim 14, wherein said calibration unit is further configured to extract input derivatives from the input signal, and correlate an ensuing conversion error to said input derivatives, said ensuing conversion error is based upon a correlation function that comprises information derived from said input signal.

16. The TI-ADC of claim 15, wherein said input derivatives are associated with a first order high-pass filter, said input derivatives corresponding to one of skew equalization and bandwidth equalization.

17. The TI-ADC of claim 15, wherein said input derivatives are associated with a second order high-pass filter, said input derivatives corresponding to one of bandwidth equalization and skew equalization.

18. The TI-ADC of claim 14, wherein said determination of simultaneously identifying said timing skew mismatch and said input bandwidth mismatch comprises equalizing each sub-ADC output to the reference ADC output using direct input derivative information.

19. The TI-ADC of claim 18, wherein said calibration unit is further configured to:
estimate skew information, said skew information comprising a sign of the error of the timing skew and errors resulting from static path mismatches, wherein said skew information is utilized by a digitally controlled delay element (DCDE) to correct the timing errors of the interleaved sampling circuits; and estimate bandwidth information, said bandwidth information comprising errors between the bandwidth of the output signals of the sub-ADCs and the reference ADC, wherein said bandwidth information is utilized by a digitally controlled bandwidth equalizer (DCBW) to correct bandwidth errors of the interleaved sub-ADCs.

20. The TI-ADC of claim 19, wherein said calibration unit is further configured to perform static equalization simultaneously with said skew information estimation, said static equalization comprising comparing the reference ADC output with each interleaved sub-ADC output.

21. The method of claim 1, wherein
the timing skew estimation circuitry comprises a first CR high-pass filter and a first zero-crossing comparator, and
the input bandwidth estimation circuitry comprises a second CR high-pass filter and a second zero-crossing comparator.

22. The method of claim 21, wherein
the first CR high-pass filter and a first zero-crossing comparator are operatively coupled to a digitally controlled delay element,
the second CR high-pass filter and the second zero-crossing comparator are operatively coupled to a bandwidth adjustment circuit, and
the digitally controlled delay element and the bandwidth adjustment circuit are utilized to generate the correction signals.

23. The TI-ADC of claim 14, wherein
the timing skew estimation circuitry comprises a first CR high-pass filter and a first zero-crossing comparator, and
the input bandwidth estimation circuitry comprises a second CR high-pass filter and a second zero-crossing comparator.

24. The TI-ADC of claim 23, wherein
the first CR high-pass filter and a first zero-crossing comparator are operatively coupled to a digitally controlled delay element,
the second CR high-pass filter and the second zero-crossing comparator are operatively coupled to a bandwidth adjustment circuit, and
the digitally controlled delay element and the bandwidth adjustment circuit are configured to generate the correction signals.

25. A time-interleaved analog-to-digital converter (ADC) comprising:

a plurality of interleaved sub-ADCs configured to sample a common input signal, said sampling corresponding to a clock signal associated with said TI-ADC, each sub-ADC further configured to convert the input signal into a digital output signal;

a reference ADC configured to sample the input signal, said reference ADC sampling aligning with said sub-ADC sampling, the reference ADC further configured to convert the input signal into a digital output signal; and a calibration unit configured to determine mismatch errors between the reference ADC output signal and each sub-ADC output signal, wherein the calibration unit further configured to identify a timing skew mismatch utilizing timing skew estimation circuitry between each output signal, the timing skew estimation circuitry comprises an analog derivative filter to obtain an input signal derivative, and said calibration unit further configured to generate correction signals in accordance with the determined mismatch errors, said correction signals accounting for said timing skew mismatch, wherein the correction signals are fed back to each sub-ADC.

26. The TI-ADC of claim 25, wherein the analog derivative filter comprises a CR high-pass filter and the timing skew estimation circuitry further comprises a zero-crossing comparator.

* * * * *